United States Patent [19]

Miller et al.

[11] Patent Number: 5,163,728
[45] Date of Patent: Nov. 17, 1992

[54] TWEEZER SEMICONDUCTOR DIE ATTACH METHOD AND APPARATUS

[76] Inventors: Charles F. Miller, 651 Pathfinder Trail, Anaheim Hills, Calif. 92807; Kenneth L. Biggs, 3047 N. Valley View St., Orange, Calif. 92665

[21] Appl. No.: 613,386

[22] Filed: Nov. 15, 1990

[51] Int. Cl.⁵ .................... B66C 1/42; B23P 21/00
[52] U.S. Cl. ........................... 294/99.1; 294/2; 294/103.1; 29/740
[58] Field of Search .......... 294/2, 99.1, 99.2, 103.1, 294/64.1, 907; 29/739, 740, 743, 795; 901/40, 41

[56] References Cited

U.S. PATENT DOCUMENTS

| | | | |
|---|---|---|---|
| 3,474,685 | 10/1969 | Miller | 414/749 X |
| 3,924,390 | 12/1965 | Alexander | 294/103.1 X |
| 4,389,912 | 6/1983 | Dallons et al. | 294/99.2 X |
| 4,414,736 | 11/1983 | Fieberg et al. | 294/103.1 X |
| 4,425,073 | 1/1984 | Mattsson | 294/103.1 X |
| 4,610,475 | 9/1986 | Heiserman | 294/99.1 X |
| 4,872,803 | 10/1989 | Asakawa | 294/99.1 X |

*Primary Examiner*—Margaret A. Focarino
*Assistant Examiner*—Dean J. Kramer
*Attorney, Agent, or Firm*—William L. Chapin

[57] ABSTRACT

A method and apparatus for attaching semiconductor dice to substrates includes a novel die-grasping apparatus and technique which employs a tweezer-like clamping device which has one fixed leg. The second leg of the clamping device is movable laterally towards the fixed leg by means of a linear actuator coupled to the movable leg through a spring. Lateral spacing between the linear actuator and the movable leg is adjustable, allowing the spring to be prestressed to a precisely adjustable value, thereby resulting in a precisely preadjustable side-gripping force on the lateral sides of a semiconductor chip or die, ensuring that the fragile die will not be broken by the grasping action. The preferred embodiment employs a micro-manipulator to precisely position a die in place on a molten solder pre-form on a substrate, and a vacuum probe for first placing the pre-form on the substrate. Also included in the preferred embodiment is a load cell responsive to a pre-determined normal force on a die in initiating lateral oscillation of the die in contact with the liquified pre-form. This "scrubbing" action improving the quality of the bond formed between the die and substrate when the solder re-solidifies.

15 Claims, 9 Drawing Sheets

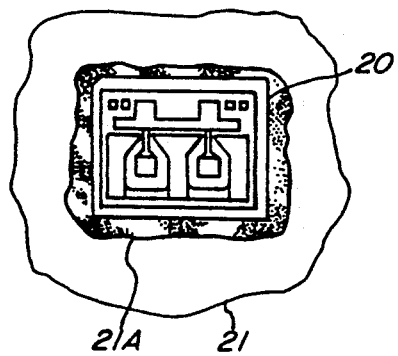
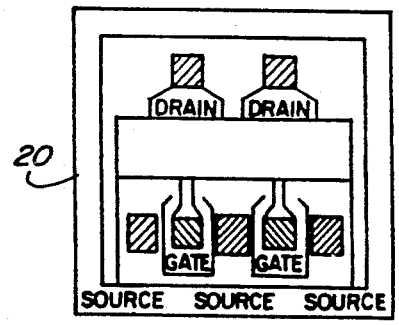
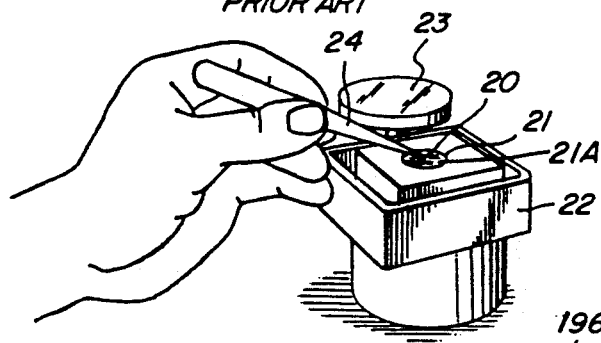
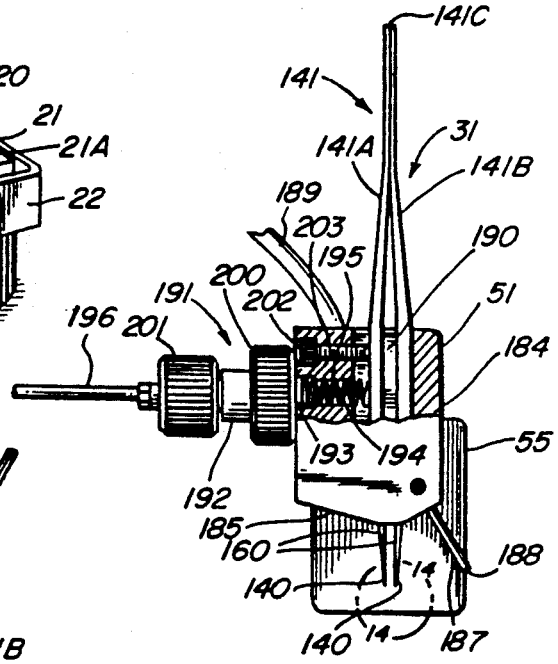
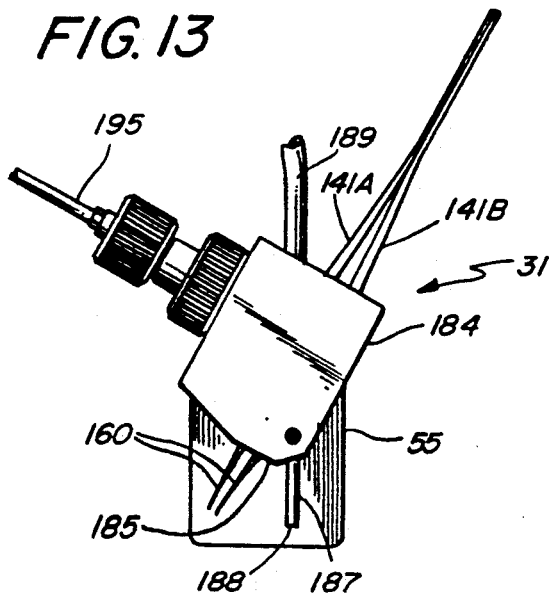
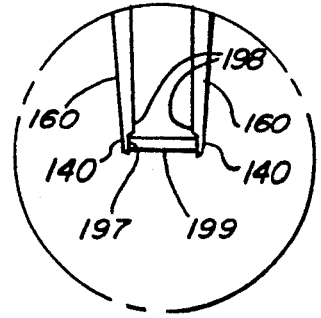

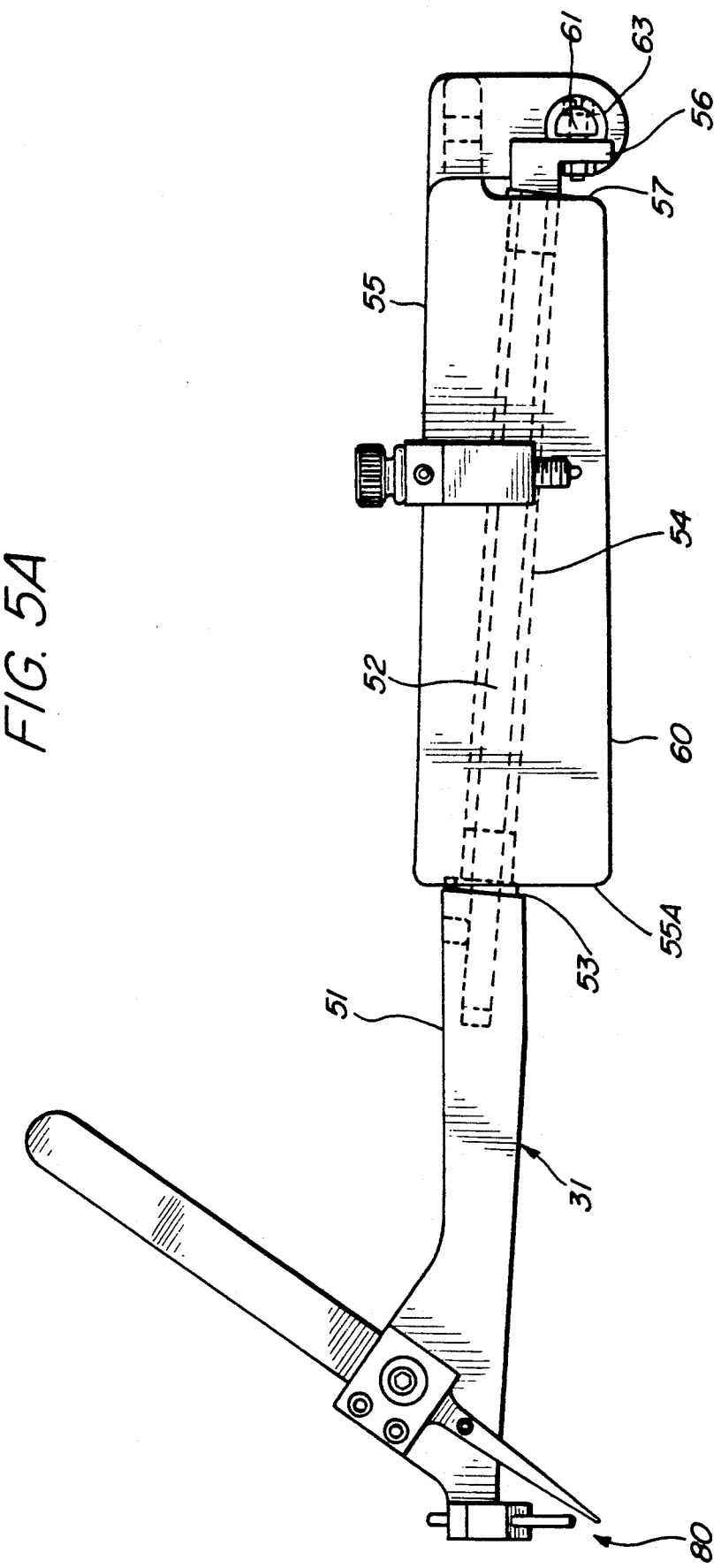

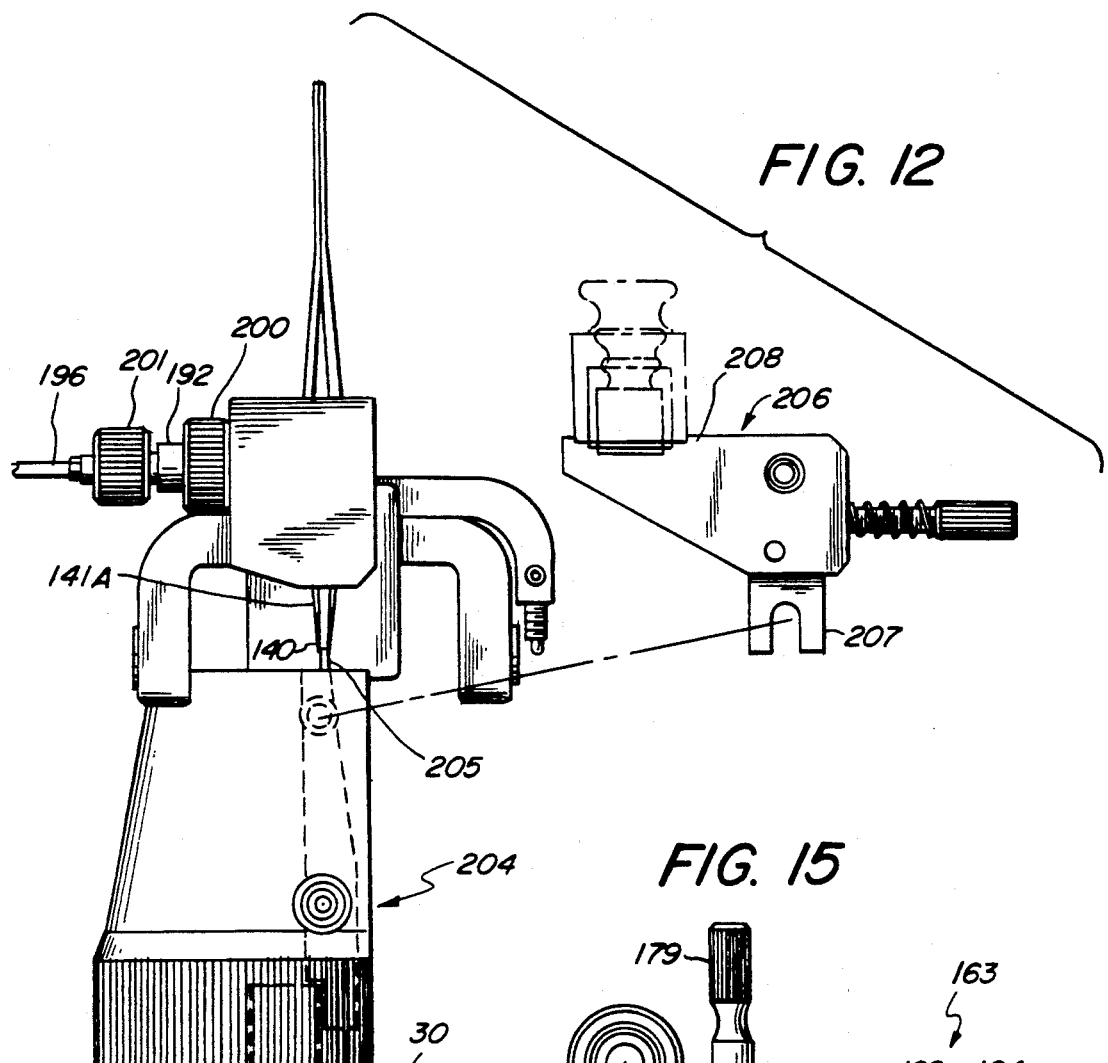
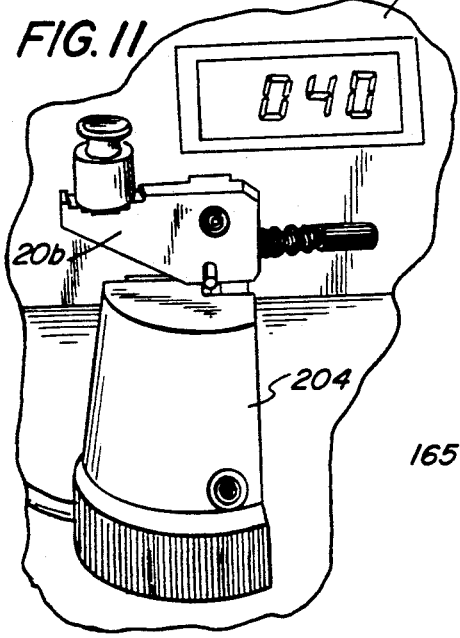

TWEEZER SEMICONDUCTOR DIE ATTACH METHOD AND APPARATUS

FIELD OF THE INVENTION

This invention relates to methods and apparatus for the manipulation of semiconductor dice or "chips." More particularly, the invention relates to an improved method and apparatus for attaching a very thin semiconductor die to a carrier or package base.

DESCRIPTION OF THE BACKGROUND ART

The invention of the transistor in 1948 was quite probably the most important technological development of the 20th century, if not all time. The transistor made it possible to construct computers of reasonable size and cost, and of much greater speed and data handling capability, and reduced power consumption than vacuum tube computers which it replaced. In the latter part of the 1950s, transistors were introduced to a wide variety of military, industrial and consumer products.

In the early 1960s, integrated circuits were introduced. Integrated circuits contain a number of transistors and interconnecting circuit elements which together comprise an operable electronic circuit, such as a logic element, amplifier, or memory element. While the first integrated circuits contained just a few transistors, integrated circuits are now being manufactured which contain tens of thousands of transistors on a single semiconductor die or chip.

Integrated circuits are fabricated from thin slices of a semiconducting material such as silicon, germanium, or gallium arsenide. The slices are cut into small squares or rectangles referred to as chips or dice, ranging in size from squares about 100 mils. on a side to several hundred mils. on a side. Transistors, diodes, resistors and interconnecting circuit paths are formed on the chip or die by diffusing impurities into selected regions of the chip, and by depositing various conducting paths and insulating layers onto the chip.

After a semiconductor chip or die has been fabricated as described above, it must be attached to a base or carrier forming part of a package or container to protect the delicate die from damage. Included in the packaging operation is the interconnection of conductive pads providing input and output ports to the die, to more robust leads or terminals which extend outward through a container or package used to enclose the die.

Most integrated circuit or discrete semiconductor device chips tend to be rather fragile because of their small size and thickness. The small size and fragility of semiconductor dice necessitates that special care be exercised in the manipulation of the dice during the manufacturing steps required to make finished devices. One method of handling semiconductor chips that has proven to be highly successful employs a vacuum probe or tube. Apparatus employing the vacuum probe method moves a flat open end of a tube into contact with the flat surface of a die, produces negative pressure in the tube to hold the die by suction while the tube and die are transported to a desired location and then releases the vacuum pressure to deposit the die at a desired location. A method and apparatus employing the above principles is disclosed in U.S. Pat. No. 3,855,034, Dec. 17, 1976, Miller, Method and Apparatus For Bonding In Miniaturized Electrical Circuits, issued to one of the present inventors. The use of a vacuum probe to manipulate semiconductors has proven to be a highly satisfactory method for manipulating a wide variety of semiconductor dice, of the type bearing one or more transistors, and integrated circuits having many transistors and associated circuit elements. However, there are some types of semiconductor chips or dice which may not be picked up with a vacuum probe, for reasons which will now be described.

Certain semiconductor chips, such as those made of gallium arsenide and used to make microwave field effect transistors (FETS) are so thin and fragile that a force of as small as a few grams applied to their planar surfaces will readily break the chips.

The present invention was devised to provide a method and apparatus for manipulating extremely fragile semiconductor dice, and for attaching dice of that type to a base or carrier.

OBJECTS OF THE INVENTION

An object of the present invention is to provide a method and apparatus for manipulating very thin, small and fragile articles such as semiconductor dice.

Another object of the invention is to provide a method and apparatus for picking up a thin, fragile semiconductor die, from a source location, moving the die to a precisely controllable destination location, and depositing the die at that destination location.

Another object of the invention is to provide a method and apparatus for bonding a fragile semiconductor die to a flat surface.

Another object of the invention is to provide a method and apparatus for grasping a fragile semiconductor die with a precisely controllable and repeatable force.

Another object of the invention is to provide a method and apparatus for manipulating an ultra-thin semiconductor die and for bonding the die to a substrate, which method can be successfully performed by a human operator of modest skills and minimum training.

Another object of the invention is to provide an apparatus capable of picking up a preform and depositing it at a precisely controllable location on a semiconductor package base, picking up a fragile semiconductor die and placing it at a precisely controllable location on the base, and oscillating the die a precisely controllable amount while in contact with a molten preform, thereby facilitating wetting the lower surface of the die and the forming of an effective bond between the die and base when the molten preform re-solidifies.

Various other objects and advantages of the present invention, and its most novel features, will become apparent to those skilled in the art by perusing the accompanying specifications, drawings and claims.

It is to be understood that although the invention disclosed herein is fully capable of achieving the objects and providing the advantages described, the characteristics of the invention described herein are merely illustrative of the preferred embodiment. Accordingly, we do not intend that the scope of our exclusive rights and privileges in the invention be limited to details of the embodiments described. We do intend that equivalents, adaptations and modifications of the invention reasonably inferable from the description contained herein be included within the scope of the invention as defined by the appended claims.

SUMMARY OF THE INVENTION

Briefly stated, the present invention comprehends a method and apparatus for manipulating very fragile semiconductor dice, having a thickness as small as 60 micrometers (microns), or about 0.00236 inch, and rectangular outline dimensions as small as 0.010 inch by 0.012 inch, and for bonding a die at a precisely controllable location on a substrate.

The method and apparatus according to the present invention includes a novel die-grasping apparatus and technique which employs a tweezer-like device which has one leg fixed. The other leg is movable towards the fixed leg by a linear actuator, to exert a precisely preadjustable side-gripping force on the lateral sides of a semiconductor chip or die.

The preferred embodiment of the method and apparatus according to the present invention also includes a three-axis (X,Y,Z) micro-manipulator which is mechanically coupled to the tweezer pick-up device. This arrangement allows the pick-up device to be precisely positioned relative to a semiconductor chip at a source location, actuated to pick up the chip, repositioned to a precisely controllable destination location, such as on the mounting surface of a carrier or substrate, and deposited there.

The preferred method and apparatus according to the present invention also includes means for oscillating a semiconductor die held within the jaws of the tweezer clamping device a precise amount, while the lower surface of the die is in contact with a liquified solder, or low melting temperature metal such as indium, on the surface of a substrate. The linear oscillation, or "scrubbing," results in uniform wetting of the lower surface of the die by molten solder, thereby improving the uniformity and strength of the bond formed when the solder solidifies.

The preferred apparatus according to the present invention also includes means for picking up and depositing a solder preform at a precisely controllable location on a substrate, prior to placing a die there.

BRIEF DESCRIPTION OF THE DRAWINGS

FIG. 1 is an upper plan view of particular semiconductor die of the type which the method and apparatus of the present invention are particularly useful for manipulating.

FIG. 2 is a schematic view of the die of FIG. 1.

FIG. 3 is a perspective view, showing a prior art method of attaching a die of the type shown in FIG. 1 to a substrate.

FIG. 5A is a fragmentary view of a tweezer clamp assembly forming part of the apparatus of FIG. 5, on a somewhat enlarged scale.

FIG. 10 is a fragmentary magnified front elevation view of part of the structure of FIG. 9, showing details of the tweezer clamp portion of the apparatus of FIG. 4.

FIG. 11 is a front perspective view showing a tweezer clamp force calibration fixture being calibrated with a weight, and showing the fixture connected electrically to the apparatus of FIG. 4.

FIG. 12 is a fragmentary view of the calibration fixture of FIG. 11, showing a bell crank of the fixture removed, and showing the clamping force of the tweezer being adjusted.

FIG. 13 is a fragmentary front elevation view of the apparatus of FIG. 4, showing the tool head holding the tweezer clamp in that rotary position in which a vacuum probe is in an operable position for picking up and manipulating into position on a substrate a solder preform on which a die is to be mounted.

FIG. 14 is similar to FIG. 13, but on a somewhat enlarged scale and showing the tweezers in a vertical position, holding a die.

FIG. 15 is a fragmentary front sectional view of a rear portion of the apparatus of FIG. 5, taken along line 15—15 of FIG. 5.

DETAILED DESCRIPTION OF THE INVENTION

Figure 4:
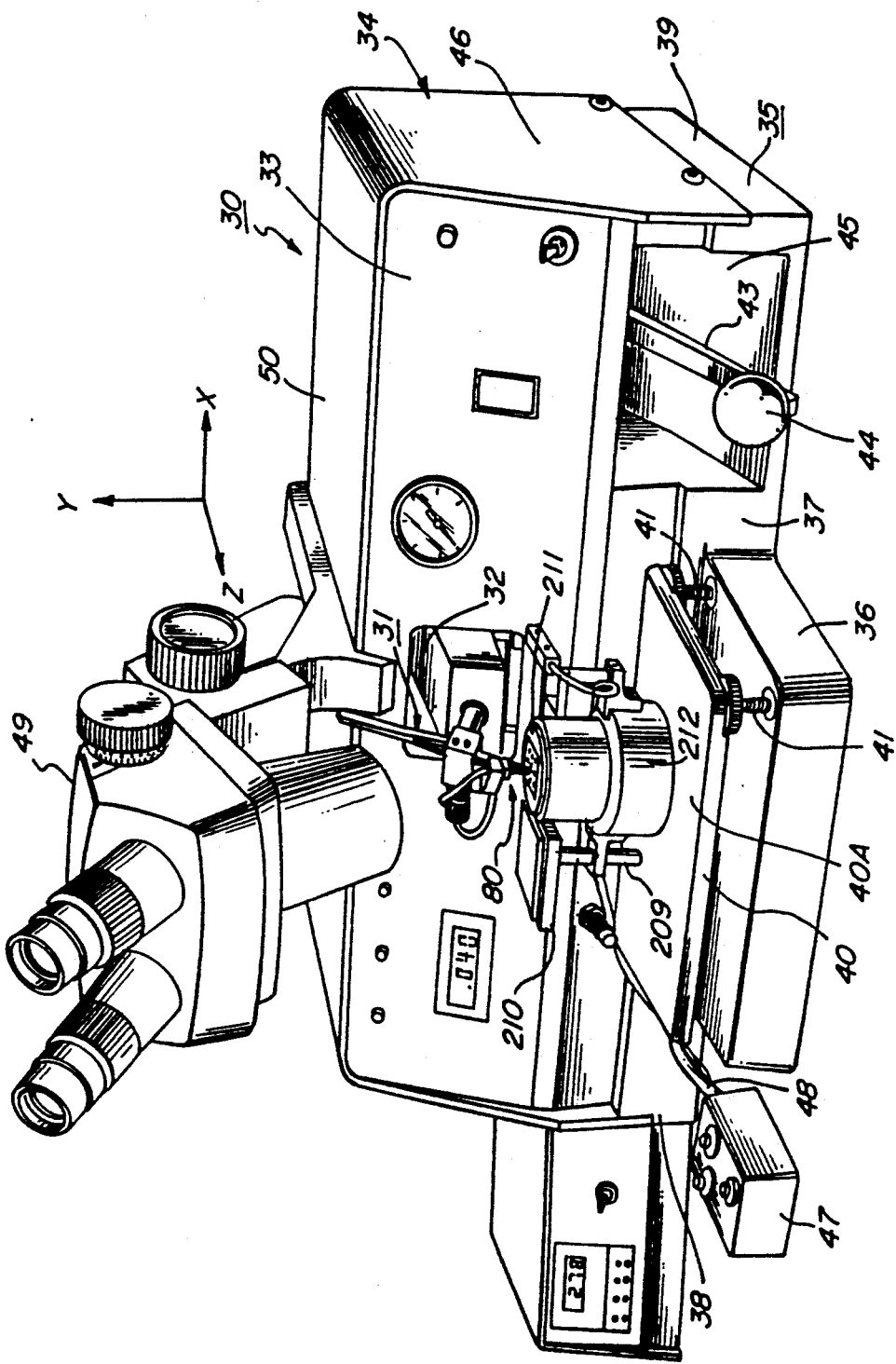
FIG. 4 is a front perspective view of a novel tweezer die attach apparatus according to the present invention.

An understanding of some of the advantages of the die attach method and apparatus according to the present invention may be facilitated by a brief description of a prior-art attach method shown in FIGS. 1-3.

FIGS. 1-3 illustrate a die attach method commonly used to attach one type of small, extremely thin semiconductor die to a carrier or substrate. The particular die shown is a gallium arsenide field effect transistor (GaAs FET), of a type used in microwave communication systems.

As shown in FIGS. 1 and 2, GaAs FET die 20 consists of an approximately square chip of GaAs material approximately 450 micrometers on a side by 6 micrometers thick. Source, drain and gate regions are formed on the chip by diffusing various dopants into the surface of the chip, and by depositing various insulating layers and conducting patterns onto the chip.

After a GaAs FET die 20 has been fabricated as described above, it must be mounted onto a substrate which provides mechanical support for the die, and for a package lid and conducting leads in some versions. Typically, a die 20 is attached to a substrate or carrier 21 by heating an alloy solder or indium pre-form 21A placed on the surface of the substrate until it liquifies, gently lowering the die onto the molten solder, and then allowing the solder to solidify. Thus, as shown in FIG. 3, a heater block 22 is used to heat a substrate 21 placed thereon. Then, a die 20 is picked up from a support table or pedestal 23 with a pair of tweezers 24, and placed down on a solder pre-form which has been placed on the surface of the substrate sufficiently long to liquify.

Die 20 is extremely thin and made of a material whose crystalline structure makes it inherently brittle. Thus, die 20 is extremely fragile, and susceptible to breakage when a force as small as a few grams is exerted on the die in a direction perpendicular to its thickness dimension. Accordingly, the only proven method of attaching a die 20 of that fragility to a substrate 21 requires that a human operator grasp opposite lateral sides of the die between the jaws of a pair of tweezers, and then place the die on a molten solder pre-form on the substrate. The die 20 is then moved back and forth on the molten solder in a "scrubbing" motion, to uniformly wet the lower surface of the die. This scrubbing action assures that the die 20 will be placed in flat contact with the surface of substrate 21, and that the die will be securely adhered to the substrate when the solder solidifies.

The manual die attachment method described above appears on the face of it to be relatively simple. In actuality, breakage of dice 20 is a frequent occurrence until an operator acquires the considerable skill to handle the tiny, extremely fragile dice. Thus, the present method of die attachment results in very low production yields, and requires excessively long operator training time.

FIG. 4 is a perspective view of a novel die attach apparatus which was devised by the present inventors to overcome some of the aforementioned shortcomings in semiconductor die manipulation.

Figure 5:
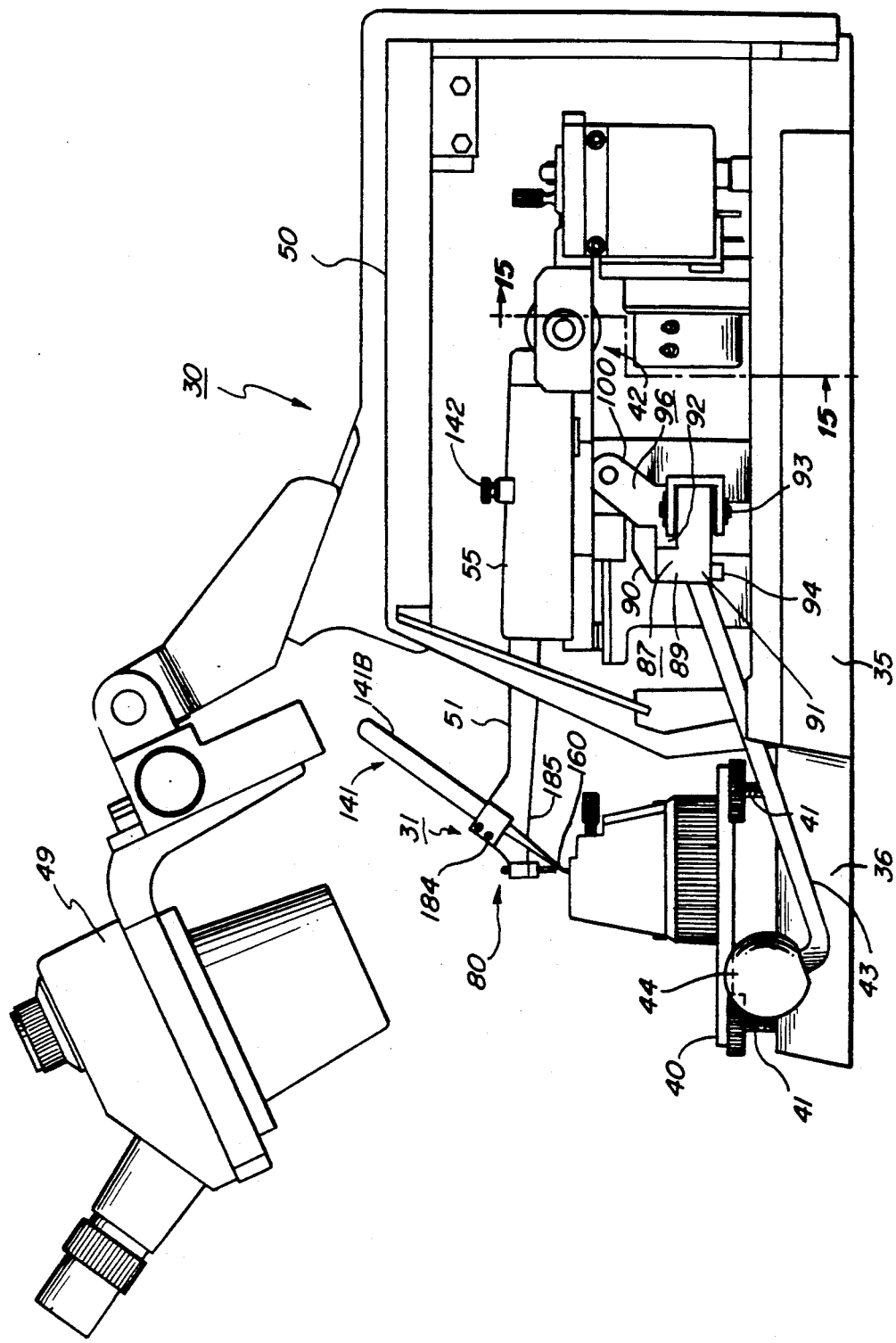
FIG. 5 is a partly sectional right side elevation view of the apparatus of FIG. 4, showing a tweezer-clamp force calibrating fixture in use.

As shown in FIGS. 4 and 5, the tweezer semiconductor die attach apparatus 30 according to the present invention includes a tweezer clamp assembly 31 which extends outwards though an aperture 32 in a front panel 33 of an enclosure 34 containing other components of the apparatus which will be described in detail below.

Enclosure 34 is supported on a base 35 which provides support for various mechanical, pneumatic, vacuum, electrical, and electronic subassemblies of apparatus 30. Base 35 preferably has a laterally elongated plan view, and has a rectangular-shaped appendage 36 which extends forward from the front edge wall 37 of the base. Appendage 36 is positioned asymmetrically with respect to the opposite left and right lateral side walls 38 and 39 of base 35, being closer to the left side wall. Thus, appendage 36 is offset to the left with respect to aperture 32 for tweezer clamp assembly 31.

Appendage 36 supports a rectangular work table 40. Work table 40 is of generally uniform thickness and has approximately the same plan-view shape as appendage 36. Work table 40 is supported at three points defining a triangle by adjustable leveling screws 41, which permit the worktable to be leveled.

Figure 9:
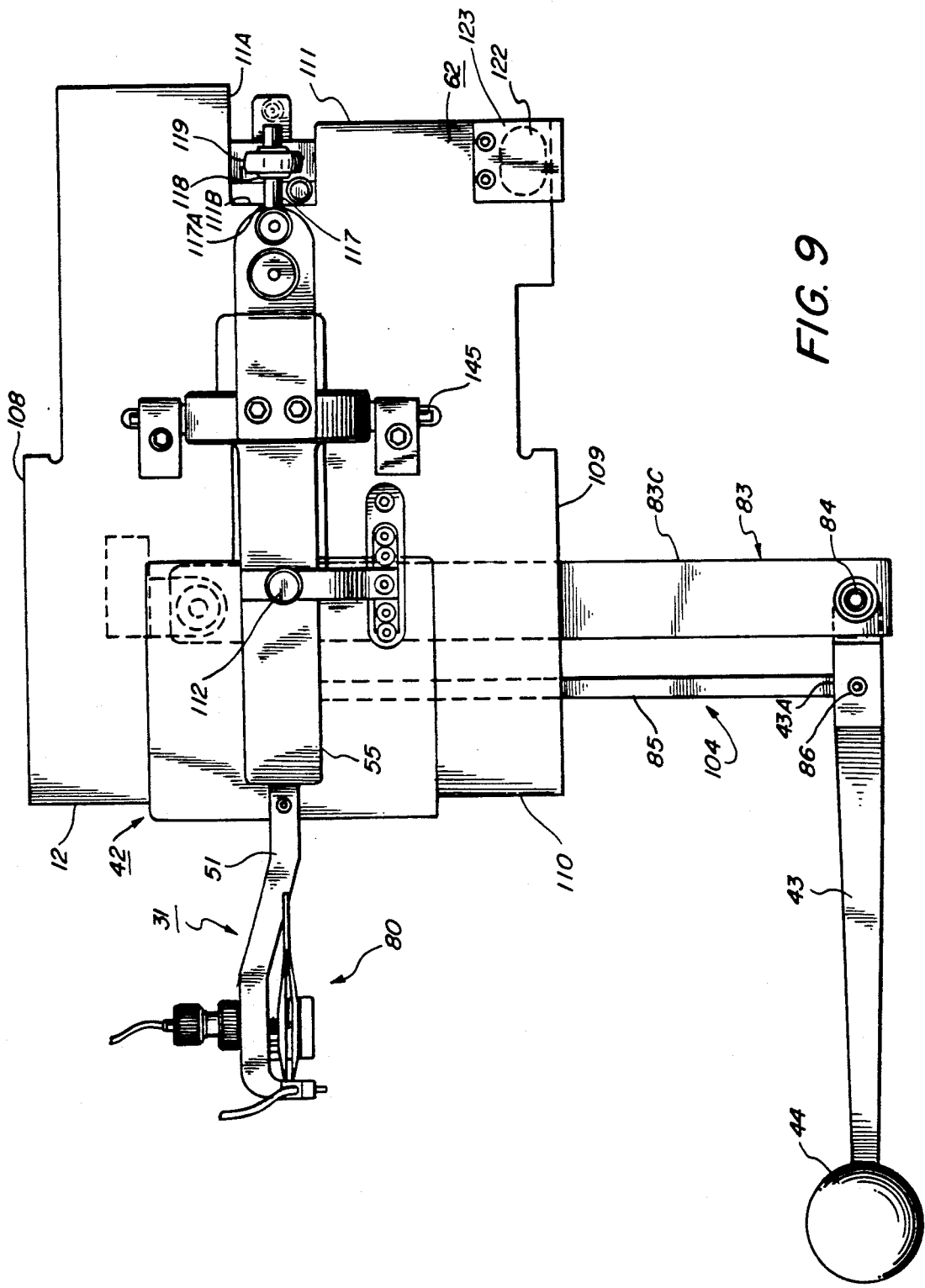
FIG. 9 is a fragmentary upper plan view of the apparatus of FIGS. 6-8.

As may be seen best by referring to FIG. 9, tweezer clamp assembly 31 is supported by an X-Y-Z micromanipulator mechanism 42. Micro-manipulator mechanism 42 includes a handle 43 with a ball-shaped hand grip 44 at one end of the handle as shown in FIG. 4. A front portion of handle 43 and hand grip 44 extends forward through a rectangular aperture 45 in front panel 33 of enclosure 34. Aperture 45 is located near right end panel 46 of enclosure 34, just above base 35.

As shown in FIG. 4, apparatus 30 preferably includes various indicators and control switches, which will be described in detail below. Preferably, apparatus 30 includes an operator control module 47 which is electrically connected by means of a cable 48 to enclosure 34.

As shown in FIG. 5, a binocular microscope 49 having a field of view which encompasses part of worktable 40 may be attached to upper panel 50 of enclosure 34. Alternatively, microscope 49 could be mounted to base 35, or placed on a horizontal surface supporting apparatus 30, and positioned over worktable 40.

As may be seen best by referring to FIG. 5A and tweezer clamp assembly 31 includes an elongated neck 51. An elongated cylindrical shaft 52 extends rearward from rear transverse face 53 of neck 51. The rear portion of shaft 52 is rotatably supported in an elongated, straight cylindrical bore 54, which is disposed through an elongated rectangular body 55. Body 55 has a generally flat base 60, and a generally rectangular shaped, vertically elongated cross section which tapers to a smaller height at the rear transverse face 57 of the body. Bore 54 is inclined at an upward angle with respect to base 60 of body 55, exiting front transverse face 55A of the body at a greater distance from the base than the rear opening of the bore.

A lug 56 attached to the rear end of shaft 52, which extends outwards from rear transverse face 57 of body 55, extends outwards from the axis of shaft 52 at an oblique angle, slightly greater than 90 degrees. That angle is so chosen that with shaft 52 rotated into that position in which lug 56 points to base 35 of apparatus 30, i.e., vertically downwards, lug 56 lies in a vertical plane. Thus with the axis of shaft 52 tilted upwards at an angle of about 5 degrees with respect to the upper surface of base 35, the angle between lug 56 and the axis of shaft 52 is about 95 degrees.

As will be described below, operation of apparatus involves rotating neck 52 in fixed angular increments, to either of the two positions shown in FIGS. 13 and 14. Lug 56 attached to shaft 52 provides part of the means for rotating the shaft and attached neck 52 a fixed angular increment, i.e. toggle whether the body 55 is positioned with its lower surface 60 horizontal, as shown in FIG. 5 or tilted upwards around a pivot axis 61 in a vertical plane with respect to a tooling table 62. Tooling table 62 comprises a flat metal plate of generally rectangular shape on which body 55 is mounted.

Figure 6:
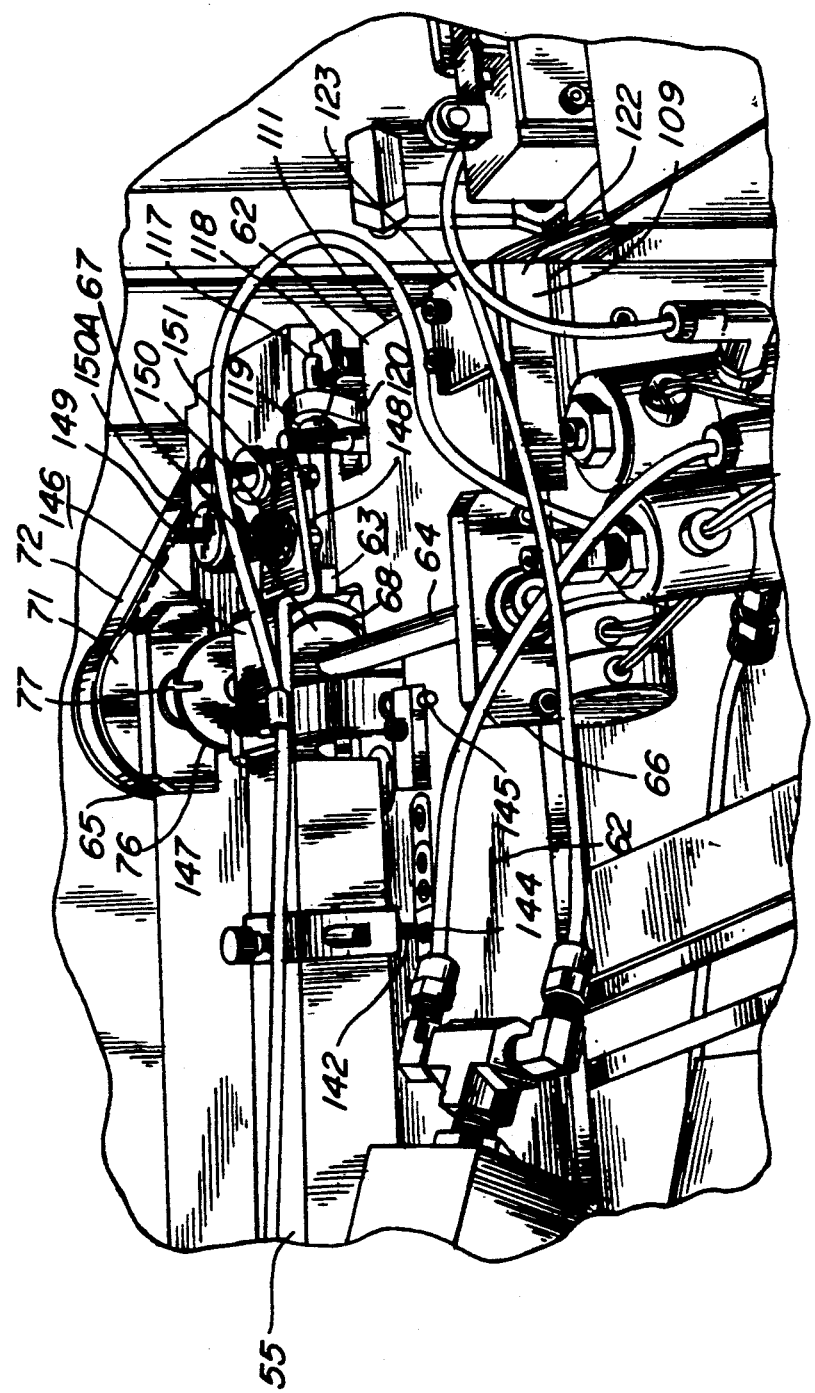
FIG. 6 is a fragmentary, partially sectional right side elevation of the apparatus of FIG. 4, on a somewhat larger scale than shown in FIG. 5.

The structure and function of other components used in conjunction with lug 56 to oscillate shaft 52 around its longitudinal axis may best be understood by reference to FIG. 6. As shown in FIG. 6, a circular-face-cam 63 is attached to an axle 64 disposed laterally above tooling table 62. Axle 64 is rotatably supported by left and right bearing plates 65 and 66 which extend perpendicularly upwards from table 62, near opposite lateral sides thereof. Face-cam 63 is positioned approximately midway between opposite lateral ends of axle 64, and slightly rearward of lug 56 attached to the rear end of shaft 52. The right side 67 of face-cam 63 has protruding therefrom an annular cam wall 68 in which is formed circularly or rotationally symmetric pairs of high and low surfaces. A cam follower not shown which is urged against cam wall not shown by a spring not shown, is connected to lug 56. The perpendicular height of the high and low portions of cam wall 68 relative to right side 67 of face cam 63 are so chosen as to produce a 30-degree rotation of shaft 52 for a 180-degree rotation of axle 64. Further 180-degree rotation of axle 64 rotates shaft 52 30 degrees in the direction opposite to its initial rotation. Thus, shaft 52 and neck 51 are caused to oscillate between two discrete positions for each 360 degree rotation of axle 64. Axle 64 is rotated in 180 degree increments as follows.

Referring to FIG. 6, the left end of axle 64 is attached to a toothed pulley 71 which is engaged by an endless toothed belt 72. Toothed belt 72 also loops tautly around a toothed drive pulley not shown which is attached to the output shaft not shown of an electric head-toggle motor not shown.

Electric head-toggle motor is operatively interconnected with electrical circuits and a shaft angle position sensor coupled to axle 64, such that each command signal inputted to the circuitry causes the axle to rotate exactly 180 degrees. Thus, as shown in FIG. 6, an optical interrupter disc or shutter 76 is attached coaxially around axle 64. Shutter 76 has two diametrically opposed apertures 77 which extend radially inwards from the outer periphery of the disc. An illumination source and photoelectric sensor (neither shown) positioned on opposite flat sides of the disc combine to produce an electrical stop command signal for motor 75 when either of the apertures 77 is positioned between the illumination source and the photosensor. The purpose for providing an oscillation capability for shaft 52 to either one of two angular positions will be described below in a description of the operation of apparatus 30.

Figure 8:
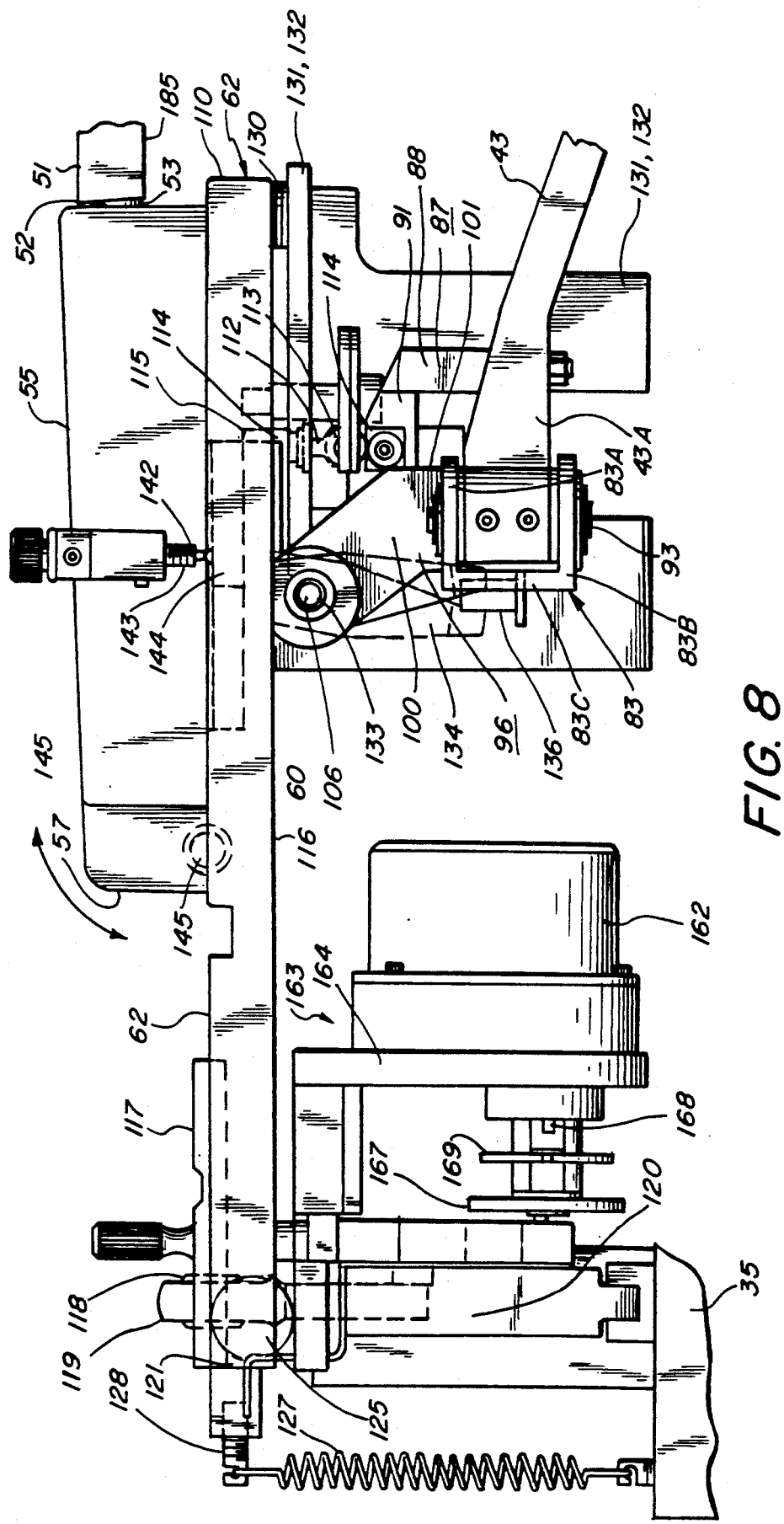
FIG. 8 is a fragmentary, partially sectional left side elevation view of the apparatus of FIG. 4 of the same scale as FIGS. 6 and 7.

As may be sen best by referring to FIGS. 5, 6, and 8, elongated rectangular body 55 rotatably supporting neck 51 of tweezer clamp assembly 31 is vertically pivotably attached to the upper surface of a tooling table 62. Tooling table 62 comprises the output element of a precise X-Y-Z micromanipulator mechanism 42, shown in FIG. 9. Micro-manipulator mechanism 42 may be of any type which performs the required functions described below. Preferably, micromanipulator 42 is constructed according to the disclosure of Miller, U.S. Pat. No. 3,474,685, Oct. 28, 1969, Micro-positioner, issued to a co-inventor of the present invention. That document is hereby incorporated by reference into this specification, to facilitate the description of the present apparatus.

The function of micromanipulator mechanism 42 is to permit positioning tool tip section 80 of neck 51 of tweezer clamp assembly 31 to precisely controllable positions in space relative to the surface of work table 40. That positioning control must encompass three degrees of translational freedom. While the specification of three cartesian axes corresponding to these three degrees of freedom is somewhat arbitrary, the following axis orientations are chosen for this disclosure.

As shown in FIG. 4, the origin of the coordinate system is chosen to lie in tool tip section 80 of tweezer assembly, when the tip is at the geometric mean of its possible translations. The "X" direction is parallel to upper surface 40A of work table 40, with excursions to the right of center designated positive. The "Y" direction is normal to work surface 40A, with upward movements designated positive. The "Z" direction is perpendicular to the front edge 40B of work table 40, with movement outwards from front panel 33 to the front edge 40B designated as positive.

As shown in FIGS. 4 and 5, tool tip section 80 is normally positioned at a point some distance above work table 40. This point is chosen as the origin for the X-Y-Z coordinate system of micromanipulator 42, and coincides approximately with a point in the upper surface of a work pedestal or cylindrical oven 212 which may be placed on the work table.

As shown in FIGS. 5 through 9, micromanipulator 42 includes a handle bar 43 angled downward slightly from the X-Z plane of the coordinate system, and has a ball-shaped hand grip 44 attached to the outer, or "PLUS Z" end of the handle bar. As may be seen best by referring to FIG. 9, the inner end of handle bar 43 is pivotably attached to the outer end of a generally horizontally disposed straight bar 83. Bar 83 functions as a rear large parallelogram bar, as will become apparent from the ensuing description. As may be seen in FIGS. 7 and 8 rear parallelogram bar 83 has a C-channel cross sectional shape, with parallel upper and lower walls 83A and 83B, respectively, and a perpendicular rear vertical wall 83C. A first axis 84 of the pivot joint between rear parallelogram bar 83 and handle bar 43 is vertically oriented, thus allowing the inner end of the handle bar to pivot in a horizontal plane with respect to the rear parallelogram bar. Preferably, as shown in FIGS. 4 and 5, the front portion of handle bar 43 angles downward from the rear portion, placing hand grip 44 close to the top of a table on which apparatus 30 may be placed. Thus positioned, hand grip may be conveniently manipulated by an operator with his or her forearm resting comfortably on the table top.

The parallelogram portion of micromanipulator mechanism 42 includes a front laterally disposed, small parallelogram bar 85. The right hand end of front parallelogram bar 85 is pivotably fastened to the lower end of short rear straight portion 43A of handle bar 43, by pivot means having a vertically disposed, second pivot axis 86. Second pivot axis 86 is parallel to and in front of first pivot axis 84.

Figure 7:
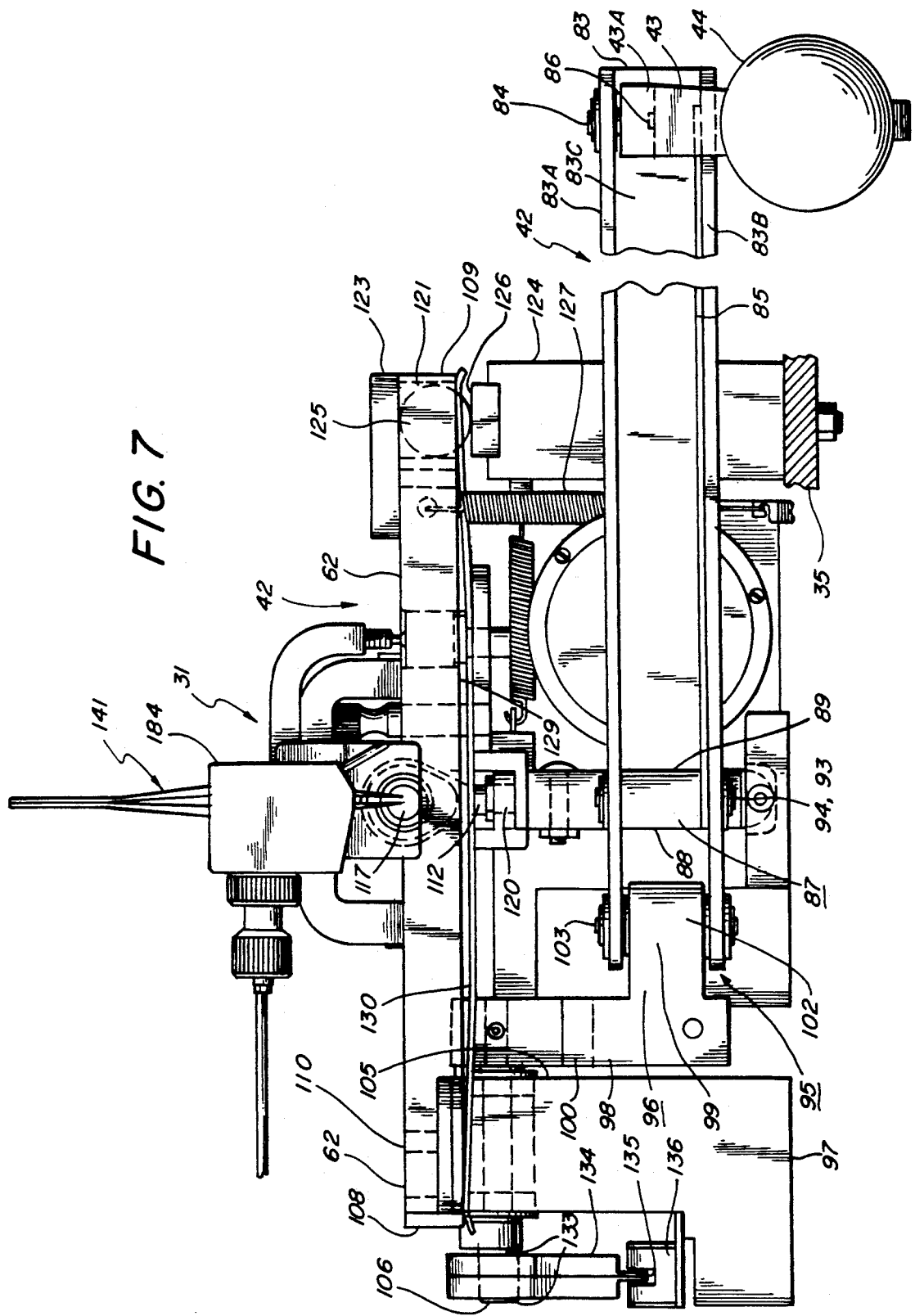
FIG. 7 is a fragmentary, partially sectional front elevation view of the apparatus of FIG. 4 on the same scale as FIG. 6.

Front parallelogram bar 85 and rear parallelogram bar 83 are held in parallel alignment but variable perpendicular spacing by pivot means joining the left, or laterally inward end portions of the two bars. Thus, as shown in FIGS. 5, 7 and 8, a C-shaped block 87 of generally uniform thickness and having vertically disposed left and right walls 88 and 89 has an upper horizontal leg 90 and a lower horizontal leg 91. A rectangular space 92 between upper leg 90 and lower leg 91 is provided for receiving upper flange wall 83A of rear parallelogram bar 83. Upper leg 90 and lower leg 91 of C-shaped block 87 are pivotably joined to upper wall 83A and lower wall 83B, respectively, of rear parallelogram bar 83, along a common, third pivot axis 93. Pivot axis 93 is vertically disposed and parallel to first pivot axis 84 and second pivot axis 86.

The inner lateral end of front parallelogram bar 85 is pivotably attached to the lower surface of lower leg 91 of C-shaped block 87 along a fourth, vertically disposed pivot axis 94. Fourth pivot axis 94 is located forward from third pivot axis a distance equal to the distance between first and second pivot axes 84 and 86. Thus, as may be seen best by referring to FIGS. 9, 5 and 7, front parallelogram bar 85, rear parallelogram bar 83, rear straight portion 43A of handle bar 43, and lower leg 91 of C-shaped block 87 comprise a parallelogram. The perpendicular spacing between front and rear bars is variable, being a minimum when handle bar 43 is pivoted in a horizontal plane to right and left maximum angular excursions away from a nominal 90 degrees position with respect to rear parallelogram bar 83. Maximum right and left excursions correspond to plus and minus "X" limits, respectively, of the micro-manipulator.

The left hand edge walls of upper and lower walls 83A and 83B, respectively, of rear parallelogram bar 83 are located laterally inwards, i.e. to the left of outwards of third pivot axis 93. As may be seen best by referring to FIG. 7, the left hand end 95 of rear parallelogram bar 83 is pivotably fastened to an L-shaped member 96, which is in turn pivotably fastened to a vertically disposed bearing support stanchion 97. L-shaped member 96 has in front elevation view the shape of an L with a vertically disposed left hand rectangular bar 98, and a horizontally disposed lower rectangular bar 99. As may be seen best by referring to FIG. 8, that portion of left hand vertical bar 98 of L-shaped member 96 extending above lower bar 99 has a straight upper section 100 which is angled rearward from front face 101 of L-shaped member 96.

As may be seen best by referring to FIG. 7, the right hand portion 102 of lower horizontal bar 99 of L-shaped member 96 is sandwiched between the outer ends of upper and lower walls 83A and 83B of rear parallelogram bar 83, and pivotably joined thereto along a fifth pivot axis 103. Fifth pivot axis 103 is parallel to pivot axes one through four, i.e., axes 84, 86, 93 and 94, respectively. Thus, the parallelogram structure 104 consisting of rear parallelogram bar 83, front parallelogram bar 85, straight rear portion 43A of handle bar 43, and C-shaped block 87, is pivotable about fifth pivot axis 103 in a generally horizontal plane with respect to L-shaped member 96.

As may be seen best by referring to FIG. 7 and 8, L-shaped member 96 is pivotably fastened to the right hand side 105 of vertical bearing support stanchion 97, near the upper end of the stanchion. The axis 106 of the pivotable means joining L-shaped member 96 to bearing support stanchion 97 is horizontally disposed, and constitutes the sixth rotation axis of micromanipulator mechanism 42.

Parallelogram structure 104, bearing support stanchion 97, and L-shaped member 96 comprise input elements which function in combination to permit precise positioning of a tool attached to tooling platform 62, as will now be described.

As may be seen best by referring to FIGS. 7, 8 and 9, tooling platform 62 is of generally uniform thickness, is nominally horizontally oriented, and has a generally rectangular plan view shape. As shown in FIG. 9, tooling platform 62 has parallel left and right side edge walls 108 and 109, and parallel front and rear parallel edge walls 110 and 111, respectively, disposed perpendicularly to the side edge walls.

Tooling platform 62 is supported near front edge wall 110, on a longitudinal line equidistant between side edge walls 108 and 109, in a manner now to be described. As shown in FIG. 8, a threaded stud 112 having an integral ball 113 formed in its base extends perpendicularly upwards from upper horizontal wall 114 of upper leg 91 of C-shaped block. The longitudinal axis of stud 112 is nominally perpendicular to the plane of parallelogram 104, and is located forward of third pivot axis 93, and rearward of fourth axis 94, at the left end of parallelogram structure 104. Ball 113 fits rotatably into a bushing 114 fitted into a bore 115 provided in the lower surface 116 of tooling platform 62. The axis of bore 115 lies along the longitudinal axis of tooling platform 107, some distance rearward of front edge wall 110 of the tooling platform.

The rear portion of tooling platform 62 is rotationally supported, as will now be described. Referring to FIG. 9, it may be seen that a cylindrical shaft 117 is mounted in a groove 117A provided in the upper surface 62A of tooling platform 62, near rear edge wall 11 of the tooling platform. Shaft 117 lies along the longitudinal center line of platform 107, equidistant between left and right edge walls 108 and 109 of the tooling platform. Shaft 117 protrudes rearward from the inner transverse wall 111B of a rectangular notch 111A cut forward from rear wall 111 of tooling platform 62. A ball 118 fits coaxially over shaft 117, rearward of rear edge wall 111 of tooling platform 107. Ball 118 fits rotatably into a socket 119. Socket 119 lies in a vertical plane, and is supported on the upper end of a generally vertically oriented rod-end bearing mount 120. The lower end of rod-end bearing mount 120 is pivotably mounted in a manner to be described below, along with a description of the purpose for that pivotability.

In addition to the two supporting points for tooling platform 62 which were described above, the tooling platform is rotatably supported at its right rear corner, i.e., diagonally inwards a short distance from right side edge wall 109 and rear edge wall 111 of the tooling platform.

Thus, as may be seen best by referring to FIGS. 7 and 9, a rectangular aperture 121 is provided through tooling platform 107, near the right rear corner 122 of the tooling platform. A flat plate 123 attached to the upper surface of tooling platform 62 covers aperture 122.

Aperture 122 through tooling platform 62 is positioned directly above a vertically disposed bearing support column 124, which is fastened at its lower end to the upper surface of base 35 of apparatus 30. A spherical ball 125 of smaller diameter than the minimum dimensions of aperture 122 is rollably positioned on the flat upper surface 126 of bearing support column 124, within aperture 122. As may be seen best by referring to FIG. 8, a tension spring 127 fastened at its upper end to a grooved screw 128 protruding from the rear wall 111 of tooling platform 62, and at its lower end to base 35, causes the lower surface of cover plate 123 to bear against the upper surface of ball 125. Thus, the right rear corner of tooling platform 107 may move translationally in the X and Z coordinate directions by rolling laterally or longitudinally, respectively, on ball 25. Also, the right rear corner of tooling platform 62 may tilt up and down on ball 125, allowing the front portion of the tooling platform, and the attached tweezer clamp assembly 31, to move up and down in the Y coordinate direction.

As may be seen best by referring to FIG. 7, the front portion of the lower surface 129 of tooling platform 62 is resiliently supported by a laterally disposed leaf spring 130. As shown in FIG. 8, leaf spring 130 is supported at left and right ends by left and right support stanchions 131 and 132, respectively.

Micro-manipulator 42 includes means for providing an electrical indicator signal responsive to the vertical or Y position of tooling platform 107, to disable rotation of tweezer clamp assembly 31 a fixed angular increment, i.e., toggling, when tool tip section 80 is low enough to be in contact with a workpiece, and to enable toggling of the tool tip section when it is raised sufficiently far above the workpiece to be safely rotated. This vertical position sensing means may be best understood by referring to FIGS. 7 and 8 as will now be described.

As shown in FIGS. 7 and 8, L-shaped member 96 is pivotably fastened to the upper end of vertically disposed bearing support stanchion 97 by means of a bearing shaft 133 held in a bore which extends laterally through the upper end of the stanchion. A flat, opaque flag 134 extends radially outwards from the outer end of bearing shaft 133, on the opposite side of bearing support stanchion 97 from L-shaped member 96.

With hand grip 44 in its lowermost position, corresponding to the lowest Y position of tool tip section 80, L-shaped member and attached bearing shaft 133 are rotated to their maximum clockwise position, as viewed from the left hand side, as shown in FIG. 8. In this position, flag 134 lies in slot 135 of an electro-optical switch 136. Thus positioned, flag 134 blocks a light beam from an illumination source within switch 136 from falling on a photo-sensor. In this position, no signal is outputted from switch 136.

When tooling platform 107 is raised sufficiently for tool tip section 80 to clear a workpiece on work table 40, flag 134 moves out of slot 135 of switch 136 allowing an electrical signal to be outputted from the switch. That signal is used to enable toggling of tweezer clamp assembly 31.

Apparatus 30 includes means for precisely determining downward forces exerted on a workpiece by tips 140 of tweezers 141 forming part of tweezer clamp assembly 31. This downward force sensing means may be best understood by referring to FIGS. 6 and 8. As shown in FIGS. 6 and 8, a threaded actuator pin 142 held at an adjustable height in a threaded vertically disposed bore 143 in elongated rectangular body 55 contacts a load cell 144 when the lower surface of the rectangular body lies in flat contact with the upper surface of tooling platform 62. Bore 143 is positioned near the longitudinal mid-point of body 55. Now as shown in FIGS. 8 and 9 the rear end portion of body 55 is pivotable about the axis of a horizontally disposed bearing shaft 145, vertically with respect to tooling platform 62. Also, an upper horizontal bar portion 147 of a Z-shaped lever bar 146 is attached to the upper wall of rectangular body 55, above bearing axis 145. A lower horizontal bar 148 of Z-shaped bar 146 extends rearward from rectangular body 55, along the longitudinal center line of tooling platform 62. A threaded stud 149 protrudes vertically upwards from tooling platform 107 through a clearance hole 150 which extends vertically through the thickness dimension of rear horizontal bar 148 of Z-shaped lever bar 146. A threaded, knurled knob 150A having a flat circular lower surface bears with a force adjustable by the knob on a helical compression spring 151 disposed between the upper surface of bar 148 and the lower surface of the knob. By applying sufficient downward force on bar 148 by tightening knob 150 on spring 151, the front portion of rectangular body 55, and therefore actuator pin 142, may be raised from load cell 144. Now, if knob 150 is adjusted so that a pre-set force of say, 4 grams for example, is exerted on load cell 144 by actuator pin 142, when the tips 140 of tweezers 141 contact a workpiece with a force equal to the pre-set force, the actuator pin will move upwards from the load cell just far enough for the load cell output signal to indicate zero force. This zero-force signal is used to initiate an operational mode of apparatus 30 which is referred to as a "scrubbing cycle," for reasons which will become apparent in the detailed description of operation of the apparatus given below.

Apparatus 30 including novel means for oscillating tweezer clamp assembly 31 along the X coordinate direction. This capability is provided to permit a semiconductor die held between the jaws 160 of tweezer 141 to be oscillated back and forth a small, precisely adjustable distance while the die is in contact with a molten solder pre-form. The small amplitude oscillation, "scrubbing" motion applied to the die facilitates wetting the lower surface of the die with molten metal. Uniform wetting of the die assists in the formation of a durable, uniform bond between the die and substrate to which it is adhered when the molten metal cools.

The structure and operation of the scrubber elements of apparatus 30 may be best understood by referring to FIGS. 6-9 and FIG. 15.

Sideways scrubbing motion of tweezer jaws 160, i.e., along the X coordinate direction, is effected by reciprocally oscillating the upper end of rod-end bearing mount 120. Thus, as shown in FIG. 15, means are provided for reciprocally driving rod-end bearing mount 120, in a manner causing the bearing mount to pivot in a vertical or X-Y plane, about pivot axis 161. This motion causes tooling platform 62, attached rectangular body 55, tweezer clamp assembly 31, and jaws 160 of tweezer 141 to oscillate in the X direction. Reciprocal motion of the upper end of rod end bearing mount 120 is caused by an electric motor 162 and associated mechanical components, as will now be described.

As shown in FIGS. 8 and 15, motor 162, rod-end bearing mount 120, and associated components comprising a scrubber mechanism 163 are mounted in a frame 164 which is fastened to the upper surface of base plate 35, near the rear edge of tooling platform 62. Mechanism 163 includes a base plate 165 in which the lower end of rod-end bearing mount 120 is pivotably held along a pivot axis 161. Attached to base plate 165 is a frame 166 on which electric motor 162 is mounted. A circular cam wheel 167 is eccentrically mounted to motor shaft 168. Also mounted to motor shaft 168 is a thin coaxial shutter disk 169. Shutter disk 169 has a radially disposed slot 110 which lies within a slot 171 in an electro-optical switch 172.

Scrubber mechanism 163 also includes a cam follower mechanism 173. Cam follower mechanism 173 includes a sub-frame 174 having a generally rectangular, vertically elongated shape. Sub-frame 174 of cam follower mechanism 173 is attached to scrubber mechanism frame 166, near the left vertical edge wall 175 of frame 166, by means of a pivot joint 176. Pivot joint 176 joins the upper left hand corners of the cam follower mechanism sub-frame 174 and frame 166.

Sub-frame 174 of cam follower mechanism 173 is caused to oscillate in a vertical plane about pivot point 176 with respect to frame 166, by means of a follower bearing 177. Follower bearing 177 is rotatably attached to the lower left corner of sub-frame 174, and rides on eccentrically driven cam wheel 167.

Cam follower mechanism 173 also includes a carrier assembly 178. Carrier assembly 178 is vertically slidable within sub-frame 174, and is positionable at a desired vertical height relative to the sub-frame by means of a knurled-end adjusting screw 179, which is rotatably attached at its lower end to the carrier assembly and threadingly attached near its upper end to the subframe. Carrier assembly 178 includes a cylindrical driver bearing 180, the periphery of which protrudes outward beyond the left hand edge wall 181 of sub-frame 174. The protruding peripheral surface 182 of driver bearing 180 tangentially contacts the right, generally vertically oriented, lateral wall surface 183 of rod-end bearing mount 120. Surface 182 of driver bearing 180 and lateral wall surface of rod-end bearing mount 120 are urged into contact by means of a spring Therefore, when sub-frame 174 of cam follower mechanism 173 is oscillated by the action of cam wheel 167 on follower bearing 177, contacting driver bearing 180 attached to the sub-frame causes rod-end bearing mount 120 to oscillate in a vertical plane. The amplitude of oscillation of rod-end bearing mount 120 can be adjusted by means of adjusting screw 179. Thus, using adjusting screw 179 to raise sub-fame 174 and attached driver bearing 180 relative to pivot axis 161 of rod-end bearing mount 120 decreases the amplitude of scrub oscillations, while lowering the sub-frame increases the amplitude. We have found that a suitable amplitude range for scrub oscillations, as measured at points 140 of tweezers 141, is approximately 0.004 inch to 0.215 inch.

Tweezer clamp assembly 31 comprises the output die manipulating mechanism of die-attach apparatus 30. The tweezer clamp assembly is used to grasp and manipulate individual semiconductor dice, and to facilitate bonding a die to a substrate.

The structure and function of tweezer clamp assembly 31 may be best understood by referring to FIGS. 4–6 and 10–14.

As shown in FIGS. 4–6, and previously described, tweezer clamp assembly 31 includes a head portion 184 positioned at the forward end of elongated neck section 51. Head portion 184 is rigidly attached to neck 51 (preferably they are fabricated as an integral unit) and both are rotatable about a common longitudinal axis to either of two discrete angular positions. Thus, as shown in FIGS. 10 and 13 neck 51 and attached head 184 may be rotated back and forth or "toggled" between either of two angular positions. Neck 51 is toggled to either of two positions, approximately 30 degrees apart from one another, by head-toggle motor as was described above.

As may be seen best by referring to FIG. 5, a tweezer 141 is held within head 184, the jaws 160 of the tweezers protruding downward from the lower, nearly horizontal surface 185 common to neck 51 and head 184. Jaws 160 are inclined at an acute forward angle of approximately 60 degrees with respect to lower surface 185 of head 184.

As may be seen best by referring to FIGS. 10 and 13, a hollow tube 187 which functions as a vacuum probe protrudes away from lower surface 185 of head 184. The bottom annular face 188 of vacuum probe 187 and tips 160 of tweezers 141 lie in a common plane, traversely disposed to the common longitudinal axes of head 184 and neck 51. A flexible vacuum hose 189 connected sealingly to the upper end of vacuum probe 187 extends upward out through head 184, as shown in FIGS. 10 and 13.

Tweezer clamp assembly 31 includes means for remotely closing tips 140 on a semiconductor die, exerting a precisely determinable lateral clamping force on the die, and releasing the die, as will now be described.

Referring to FIGS. 5 and 10, it may be seen that tweezers 141 have flat, rectangular plan-view, parallel left and right leg sections 141A and 141B formed of spring steel joined at their upper ends by a butt weld 141C. The medial longitudinal portions of leg sections 141A are bent away from one another, and held within a bore 190 through head 184. Tweezers 141 have tapered jaws 160 which angle towards one another and protrude below lower surface 185 of head 184.

Right leg 141B of tweezers 141 is rigidly attached to head 184, while left leg 141A is movable with respect to the right leg. Thus, as shown in FIG. 10, tweezer clamp assembly 31 includes a linear actuator 191 for closing jaws 160 of tweezers 141 by moving left leg 141A towards fixed right leg 141B.

Linear actuator assembly 191 includes a pneumatic cylinder and piston assembly 192. Pneumatic cylinder 192 is of the type that has a piston rod extending through one circular end wall of the cylinder, the rod moving outwards when the cylinder is pressurized, to a maximum extension limited by contact of a piston within the cylinder with an internal stop.

As shown in FIG. 10 a circular driver disk 193 is fastened to the outward extension of a piston rod (not shown) within pneumatic cylinder 192. A helical compression spring 194 held slidably within a bore 195 transversely disposed in head 184 bears resiliently against the right side of driver disk 193, at the left end of the spring, and the left side of movable lefthand leg 141A of tweezers 141, at the right end of the spring. When air pressure is applied through a pressure hose 196 to pneumatic cylinder 192, closing pressure is thereby applied to tips 140 of tweezer jaws 160.

As shown in FIG. 14, the inner facing surfaces of tips 140 of tweezer jaws 160 have flat undercuts 197 forming shoulders 198 which slant upwards from the front to rear edge of each jaw, at an angle of about thirty degrees. Thus, with the longitudinal axis of tweezers 141 inclined at an angle of thirty degrees to the vertical, as shown in FIGS. 5 and 14, shoulders 198 are horizontally positioned to accommodate the flat upper surface of a semiconductor die 199.

The lateral gripping force exertable by jaws 160 on a semiconductor die 199 held as shown in FIG. 14 is precisely adjustable by varying the lateral extension of pneumatic cylinder assembly 192 from head 184 of tweezer clamp assembly 31, and, therefore, the compressive force exerted on left hand-leg 141A of tweezer 141, when the pneumatic cylinder assembly 192 is pressurized. This adjustment is made by loosening a knurled locking bushing 200 holding cylinder assembly 192 in place in head 184, and then turning knurled cylinder adjustment bushing 201 to move the cylinder laterally inwards or outwards from head 184 to exert more or less closing force, respectively. The open spacing between tips 140 of tweezer jaws 160 is adjustable by means of a set screw 202 held in a threaded bore 203 in head 184 and bearing against left-hand leg 141A of tweezers 141.

The lateral closing force of tips 140 of tweezers 41 is set to a precisely pre-determined value, so that a fragile semiconductor die may be grasped and manipulated without breaking the die, as follows. Referring to FIG. 11 and 12, a clamping force calibration fixture 204 having a vertically disposed input lateral force sensing input lever 205 is coupled electrically to apparatus 30. Within the apparatus is signal processing circuitry which produces a visual read out of force exerted on lever 205. A bell crank 206 is temporarily pivotably attached to the upper end of calibration fixture 204. Bell crank 206 has a notched output arm 207 which engages input lever 205 of calibration fixture 204. Bell crank 206 also has a horizontally disposed weight platform 208 which causes arm 207 to exert a lateral force on input lever 205 of fixture 204, which force is in a fixed, precise ratio to the weight placed on the platform, thus allowing the lateral force sensitivity of the fixture to be precisely calibrated.

After fixture 204 has been calibrated as described, bell crank 206 is removed. The fixture is then positioned as shown in FIG. 12, so that input lever 205 of the fixture is between tips 140 of tweezers, adjacent the left hand jaw tip. Pneumatic cylinder 192 is then pressurized, causing tip 140 of left hand leg 141A of tweezer 141 to move lever 205 laterally inwards. The magnitude of the force is indicated precisely by a visual readout device on apparatus 30. This allows the closing force to be precisely adjusted, by means of bushings 200 and 201, to a desired value.

Fixture 4, 13 and 14 illustrate operation of the invention. In FIG. 13, head 184 of tweezer clamp assembly 31 is toggled clockwise, placing vacuum probe 187 in a vertical position. With head 184 in this position, handle 44 of micromanipulator 42 is used to position vacuum probe 187 over a pedestal 209 having a flat table 210 containing solder pre-forms. Probe 187 is then moved downward into contact with the upper surface of a solder pre-form, and negative pressure applied to the probe, causing the pre-form to adhere to the probe. Micromanipulator 42 is then used to move vacuum probe 187 and an attached pre-form into position over a substrate 211 on the upper surface of an oven 212. Vacuum pressure is then removed, allowing the preform to drop into a desired position on the substrate.

Handle 44 is then used to raise tweezer clamp assembly 31 vertically upwards. When head 184 of tweezer clamp assembly 31 has been elevated sufficiently for flag 136 to clear electro-optical switch 136, a toggle command inputted via pushbutton on operator control module 47 causes toggle motor 75 to be energized This causes head 184 to toggle into the position shown in FIGS. 10 and 14, with the jaws 160 of tweezer 161 vertically oriented. With the jaws 160 thus positioned, handle 44 is used to move jaw tips 140 into position adjacent a semiconductor die 199, which may be on table 210 or at a different location. A tweezer switch on control module 47 is then depressed, pressurizing pneumatic cylinder 192 and thereby grasping die 199 between jaws 140.

Handle 44 of maximanipulator 42 is then used to move semiconductor die 199 into position over a molten solder preform on substrate 211 lying on oven 212. Die 199 is then moved downwards into contact with the molten pre-form. When the downward force exerted by tips 140 of tweezer jaws 160 equals the force pre-set for the internal load cell 144, an enabling electrical signal is generated by the internal load cell circuitry. This enabling signal, in conjunction with a signal produced by depressing a SCRUB/VAC pushbutton on operator control module 47, energizes scrubber motor 162. Energization of scrubber motor 162 causes tips 40 of jaws 160 to oscillate die 199 laterally across the surface of substrate 211. This "scrubbing" motion facilitates formation of a good bond between the die and substrate. A control switch on front panel 33 of apparatus 30 pre-sets the number of scrub cycles to a desired value. Shutter disk 169 and electro-optical switch 172 of scrubber mechanism 163 co-operate to enusure that the scrub oscillations are equidistant from the initial die position, and ensure that the die is returned to that position upon completion of the scrub cycles.

What is claimed is:

1. An apparatus for grasping and manipulating fragile articles comprising:
   a. a clamp assembly having a first, fixed leg comprising an elongated metal strip of generally uniform thickness, and a second, movable leg essentially mirror symmetric with said first leg, said first and second legs being joined at a first, upper end, bowing outwards from a central longitudinal mirror plane, and bowing inwards to form two laterally spaced apart jaw tips,
   b. linear actuator means for alternatively moving said second leg towards and away from said first leg, said actuator means having a housing and a movable element movable with respect to said housing,
   c. spring coupling means interposed between said linear actuator means and said second movable leg,
   d. means for adjustably moving said housing of said linear actuator with respect to said second movable leg, thereby adjusting the closing force exertable on an article by said first and second legs, and
   e. spring bias means for elastically biasing said first and second legs to a laterally spaced apart position.

2. The apparatus of claim 1 wherein said first and second legs are leaf springs.

3. The apparatus of claim 2 wherein said leaf springs have first, upper straight portions having inner facing parallel faces joined together and lower, tapered jaw portions bowed apart from one another.

4. The apparatus of claim 3 further including means for adjusting that quiescent spacing between the inner facing surfaces of said jaw portions which occurs when said actuator means is de-energized.

5. The apparatus of claim 1 wherein said clamp assembly comprises essentially a pair of tweezers.

6. The apparatus of claim 1 wherein said linear actuator is adjustably fixed to said clamp assembly, thereby allowing adjustment of the closing force exertable on a semiconductor die positioned between said first and second jaws.

7. The apparatus of claim 6 further including adjustment means for adjusting the quiescent spacing between the inner facing surfaces of said jaw ends which occurs when said actuator is de-energized.

8. The apparatus of claim 7 wherein said adjustment means comprises a member fixed to said clamp assembly and capable of exerting an adjustable closing force on said second jaw opposing said opening-biasing means tending to separate said jaw ends.

9. The apparatus of claim 8 further including micromanipulator means for translating said jaws of said clamp assembly to precisely determinable coordinates.

10. The apparatus of claim 9 further including means for laterally oscillating said jaws of said clamp assembly.

11. The apparatus of claim 10 further including force sensing means adapted to produce an enabling signal upon sensing a longitudinally upwardly, directed reaction force, of a pre-determined magnitude, on said jaws responsive to downward pressure of a pre-determined magnitude, on said jaws responsive to downward pressure of a pre-determined magnitude exerted by a semiconductor die held between said jaws on a substrate, said enabling signal allowing application of drive power to said lateral oscillation means.

12. The apparatus of claim 11 further including means fixed to said clamp assembly for picking up and depositing a solder pre-form.

13. The apparatus of claim 12 wherein said pickup means is further defined as being a vacuum probe.

14. The apparatus of claim 13 wherein said vacuum probe is further defined as an elongated tube inclined to the longitudinal axis of said first and second legs.

15. The apparatus of claim 14 further including toggling means, whereby said clamp assembly may be rotated to alternately position said jaw tips or said vacuum probe opening in contact with a work piece.

* * * * *